United States Patent
Chamon et al.

(10) Patent No.: US 7,230,415 B2
(45) Date of Patent: Jun. 12, 2007

(54) QUANTUM JUNCTION DEVICE AS SWITCH AND DETECTOR

(75) Inventors: Claudio Chamon, Lexington, MA (US); Ian Affleck, Vancouver (CA); Masaki Oshikawa, Kawasaki (JP)

(73) Assignee: The Trustees of Boston University, Boston, MA (US)

( * ) Notice: Subject to any disclaimer, the term of this patent is extended or adjusted under 35 U.S.C. 154(b) by 212 days.

(21) Appl. No.: 10/988,927

(22) Filed: Nov. 15, 2004

(65) Prior Publication Data

US 2006/0114096 A1    Jun. 1, 2006

(51) Int. Cl.
*G01R 33/02* (2006.01)
*A61B 5/05* (2006.01)
(52) U.S. Cl. .................................. 324/158.1
(58) Field of Classification Search ............ None
See application file for complete search history.

(56) References Cited

U.S. PATENT DOCUMENTS

| | | | | |
|---|---|---|---|---|
| 3,936,809 A | * | 2/1976 | Zappe | 365/162 |
| 4,843,504 A | * | 6/1989 | Barnes | 505/171 |
| 4,913,152 A | * | 4/1990 | Ko et al. | 600/409 |
| 5,075,281 A | * | 12/1991 | Testardi | 505/192 |
| 5,376,626 A | * | 12/1994 | Drehman et al. | 505/234 |
| 5,646,526 A | * | 7/1997 | Takeda et al. | 324/248 |
| 6,339,328 B1 | * | 1/2002 | Keene et al. | 324/248 |

* cited by examiner

*Primary Examiner*—Paresh Patel
(74) *Attorney, Agent, or Firm*—Weingarten, Schurgin, Gagnebin & Lebovici LLP

(57) ABSTRACT

A quantum junction device having three or more wires connected to a loop surrounding a magnetic flux is used to act as a switch responsive to magnetic flux and therefore useable for mass storage devices or as a flux detector by sensing current direction, conductance tensor, in response to a magnetic field under test.

21 Claims, 4 Drawing Sheets

QUANTUM JUNCTION DEVICE AS SWITCH AND DETECTOR

STATEMENT REGARDING FEDERALLY SPONSORED RESEARCH OR DEVELOPMENT

This invention was made with Government Support under Contract Numbers DMR-0203159 and DMR-9876208 awarded by the National Science Foundation. The Government has certain rights in the invention.

BACKGROUND OF THE INVENTION

Known devices such as SQUID's are superconducting devices which operate at extremely low temperatures to achieve superconductivity conditions. These and other devices also operate in the domain of thousands of conductivity channels or electron modes for conductivity. Such large numbers of channels typically indicate operation as a so-called Fermi liquid and provides relative insensitivity to magnetic fields either for detection or for conduction switching above superconducting temperatures.

These prior devices can be used as magnetic field sensors and data storage read-out devices. The problems of requiring superconductivity, and relatively large size as well as limited response speeds make such prior art devices less competitive with conventional magnetic field sensors above superconducting temperatures and conventional read-out devices such as magnetic based hard drives read-heads in terms of storage density.

BRIEF SUMMARY OF THE INVENTION

According to the present invention a quantum junction device is provided which has small size, rapid response times and relatively high sensitivity. This is achieved by providing a conductive loop to which three conductors lead at roughly equally spaced locations around the loop. The structure is dimensioned with a thinness in the nanometer or micrometer scale in order to limit the number of conduction channels, for example, to 100 or less, so as to operate as a Luttinger liquid or as a non-Fermi liquid.

Using appropriate voltage and current sources and detectors as well as flux sources, the device can be used for data storage read-out because of its potential to switch states or conductance tensors in response to an applied magnetic field. Similarly the device can be used, because of its propensity to switch in the presence of a magnetic field, to detect such magnetic fields either singly or over an area in the case of arrayed junction devices.

BRIEF DESCRIPTION OF THE SEVERAL VIEWS OF THE DRAWINGS

These and other features of the invention are more fully set forth below in the detailed description of the invention and the accompanying drawing of which.

DETAILED DESCRIPTION OF THE INVENTION

The present invention contemplates using a conductive loop accessed by three wires dimensioned on micrometer and nanometer scales to permit operation in a non-Fermi liquid regime. Preferably the device is maintained at a condition where electron interactions are characterized by a Luttinger (or Tomonaga/Luttinger) liquid. The device of claim 1 has a conductive loop 10 and three conductors 12, 14 and 16 preferably, but not necessarily, spaced equally apart around the loop connected to voltage and/or current sources and detectors as discussed below. A magnetic field illustrated by flux 18 is applied through the center of the loop 10 along an axis perpendicular thereto. Addition of conductor(s) 8 and source/detector(s) may be used as well as to enhance the functions. For example, with four conductors, opposite pairs can operate as source and switched outputs respectively.

Figure 1:
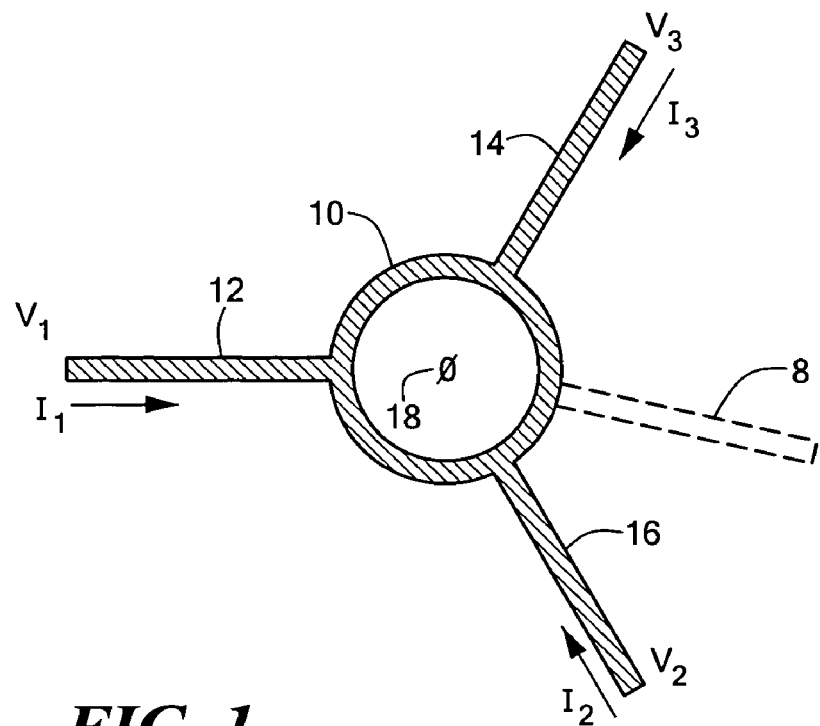
FIG. 1 shows a quantum junction device according to the invention.

For operation as a quantum junction device, the device of FIG. 1 is dimensioned, particularly in thickness, so as to provide a limited number of conduction channels, such as 1, 10, 20, 50, 80 but no more than about 100. A thickness, material type and temperature condition determines the existence of a non-Fermi liquid operating regime. Considerations of a theoretical nature are found in the attached Appendix comprising a paper entitled "Junctions of Three Quantum Wires."

In particular, in the quantum regime the magnetic flux 18, for example, can cause switching of the current between connectors 12 and 14 in one flux condition and conductors 12 and 16 in another flux condition. The switching speed can be extremely fast making such device useful as a digital data bit retrieving element in mass storage devices for data storage. The device is not required to operate at superconducting temperatures though switching sensitivity to the magnetic flux is substantially enhanced at such low temperatures. The switching profile stretches out as the temperature rises to such conditions as room temperature.

Figure 2A:
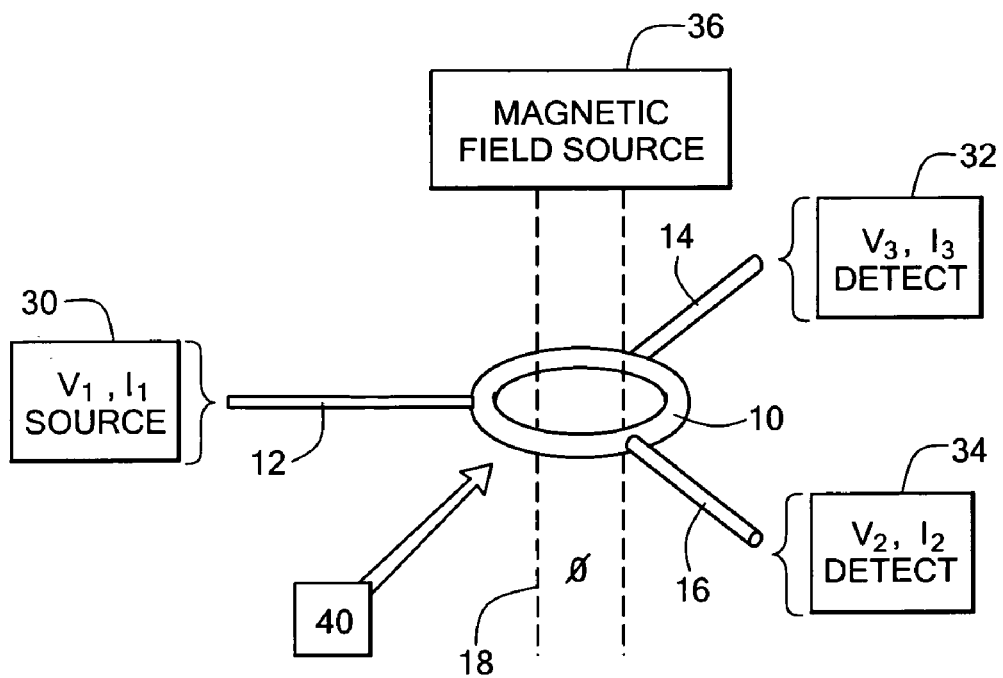
FIGS. 2A–C show a quantum junction device of the type illustrated in FIG. 1 in association with electronics, electric current and voltage and magnetic flux for use as a switch or reading magnetic fields.
Figure 2B:
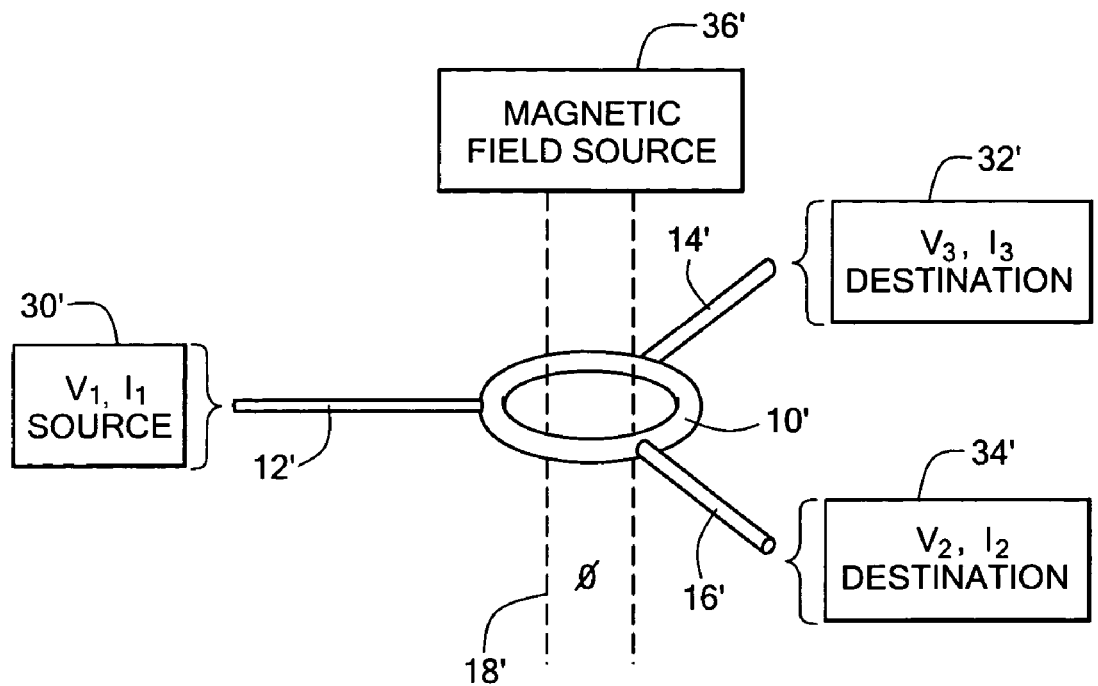
Figure 2C:
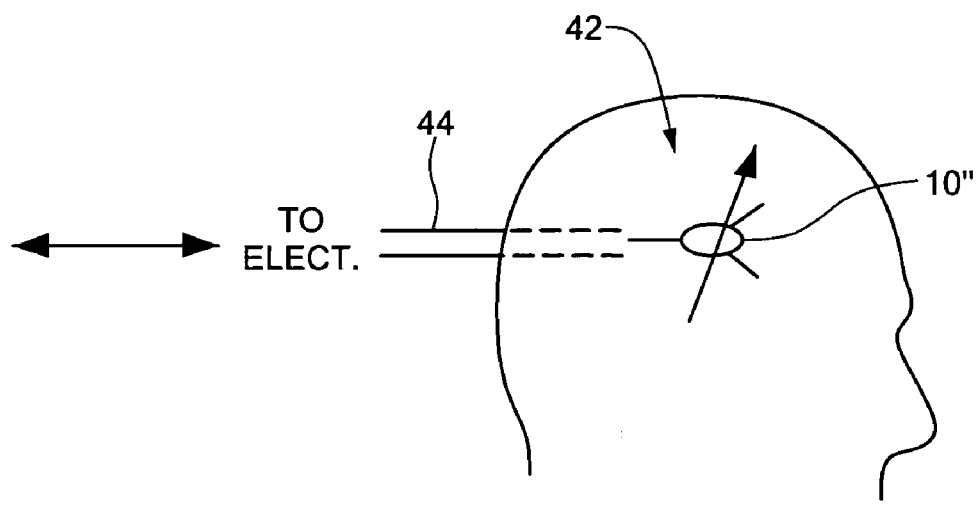
Figure 3:
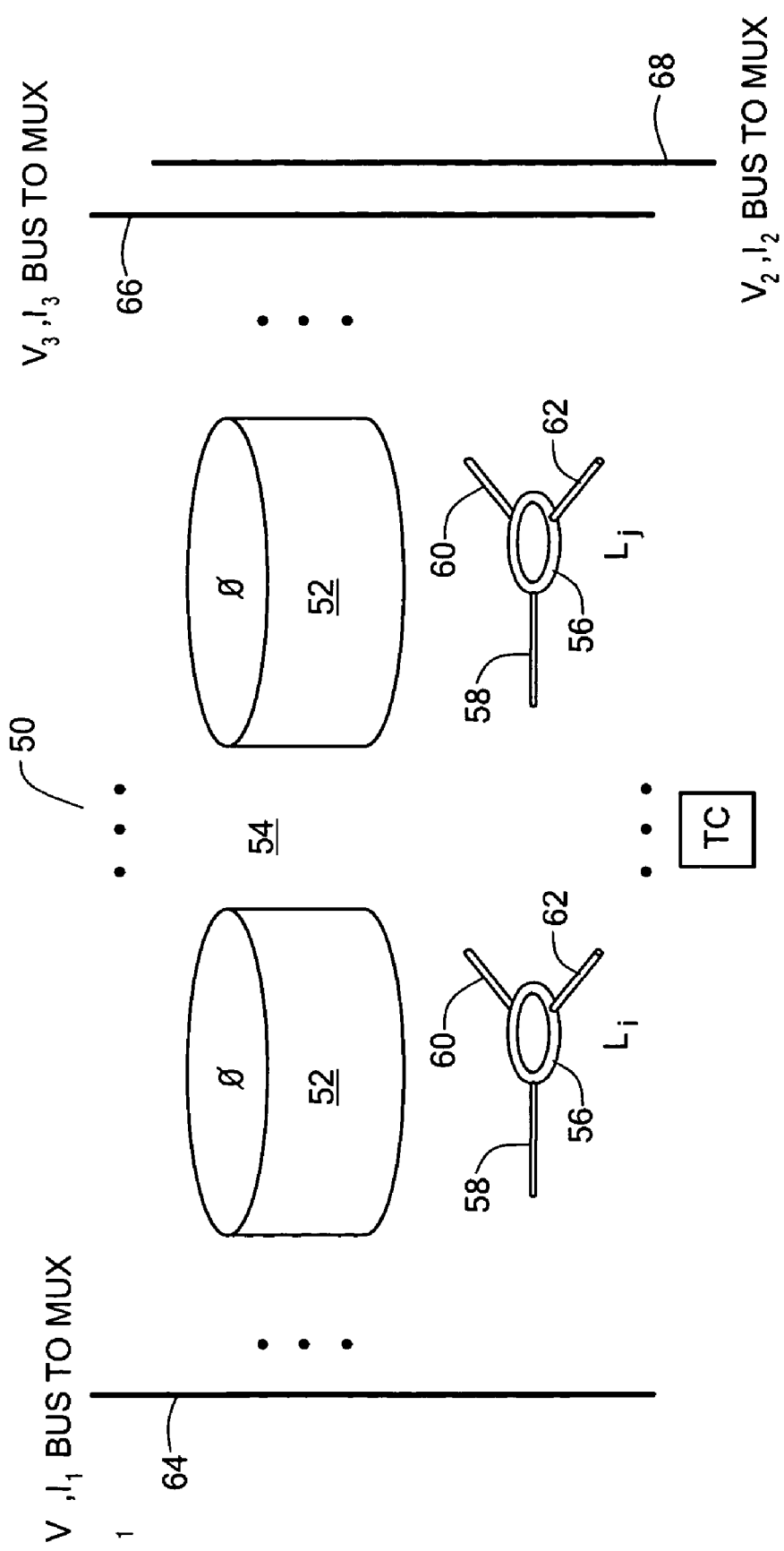
FIG. 3 illustrates the application of the invention for high-density data storage readout.

From a theoretical standpoint, the electrical response of this device is characterized by the conductance tensor $G_{jk}(\varnothing)$ that relates the currents $I_j$, FIG. 1, 2 or 3, flowing into the junction from wire j (12, 14, 16) when voltages $V_k$ are applied to wire k (12, 14, 16):

$$I_j = \Sigma G_{jk}(\varnothing) V_k \qquad (1)$$

From current conservation, $\Sigma G_{jk}(\varnothing) V_k = 0$. The conductance depends explicitly on the magnetic flux that is encircled by the ring because of quantum mechanical phase effects.

The two functions of the device, as a switch and as a detector, follow from the magnetic flux dependence of the conductances $G_{jk}(\varnothing)$.

(1) To function as a switch: a current is injected through one of the leads, say lead 12, and the magnetic flux 18 controls through which of the other two leads, 14 or 16, most of the current flows out. In extreme cases, the current is fully diverted from lead 12 to either lead 14 or 16 depending on the magnetic flux 18 encircled by the loop.

(2) To function as a detector: a current is injected through one of the leads, say lead 12, and the presence of a magnetic flux 18 is detected by reading the current that flows through the other leads, 14 or 16. An asymmetry in the flow of currents to leads 14 and 16, quantified by $I_2$ and $I_3$, which depends on ø, provides a means to detect small magnetic fields that give rise to a flux that threads the inside of the ring.

The principle behind the device functioning is quantum interference in the case of both micrometer and nanometer scale wire-junctions. For nanometer scale devices, electron-electron interaction effects are responsible for non-linearities that make the device's response to an applied flux more pronounced.

The device differs from the so-called SQUID or superconducting devices by allowing scaling to very small size and limiting the conduction channels to be on the order of 100 or less channels. By limiting the conduction channels, electron behavior no longer is visualized as a fluid of independent electrons but more as a Luttinger liquid of interacting electrons, which can exhibit an attraction between electrons that provides for the switching function but at a warmer than a superconducting temperature such as, for example, room temperature if desired. The electron attraction interaction and the limited channel dimensions are what particularly characterize the device.

The ring can be formed of any number of materials including, for example, copper, gold, silver, aluminum or of structures as carbon nanotubes or of semiconductor materials. The term channel is used in this invention to represent the number of electron modes in the conduction process. The well known Schroedinger equation and the lateral confinement potential of the wire defines the allowed quantum modes or channels that can propagate along the wire. As a result, the thinner the wire structure of the invention is, the fewer the channels or electron conduction modes. The material used for the junction device of the invention also has an effect on the electron density in the wire and thus the number of channels or electron modes for a given thickness.

FIG. 2A illustrates the use of the quantum junction device as a magnetic field detector. As shown there, a source for voltage and/or current 30 applies an input to the lead 12 coupled to the quantum loop 10. First and second output leads 14 and 16 are connected to respective voltage and/or current detectors 32 and 34. The loop 10 is positioned near a source 36 for a magnetic field 18 such that the flux passes through the loop 10. The signal on leads 14 and 16 indicate the presence and/or strength of the field.

FIG. 2B illustrates the use of the quantum loop as a switch. In this case, the loop 10' has an input 12' and first and second output conductors 14' and 16'. A voltage and/or current signal from a source 30' is applied through the input conductor 12' to the loop 10'. A magnetic field source 36' applies a magnetic field 18' or not depending upon whether the signal on input lead 12' is to be directed to output conductor 14' or 16'. Voltage and/or current destinations 32' and 34' are provided to receive the majority of the switched signal for subsequent processing.

FIG. 2C illustrates one application for the quantum loop device of the present invention as a detector. In this case, the device is used to detect magnetic flux from minute sources within a human brain 42. A quantum loop 10" is placed on a probe 44 which is inserted into a region of the brain 42 where it is desired to detect the presence of a magnetic field for medical diagnostic purposes.

FIG. 3 illustrates the use of a quantum loop of the invention as a readout device for data stored magnetically within a structure 50. In particular, data is stored within minute magnetic elements 52 within an array 54. Each magnetic element has a quantum loop 56 associated with it with corresponding input conductors 58 and output conductors 60 and 62. Each of the input connectors is supplied with a voltage and/or current signal from a bus 64, typically supplied from a multiplexer, while the output leads 60 and 62 provide signals to respective voltage and/or current output buses 66 and 68, similarly connected through a multiplexer for connection to electronics to provide readout of the state of each of the magnetic elements 52. Magnetic elements 52 and 54 may, typically be permanent magnets or magnetic regions of a magnetic sheet material on a tape or hard drive. Alternatively, a single loop 56 may be scanned over the array 50.

Figure 4:
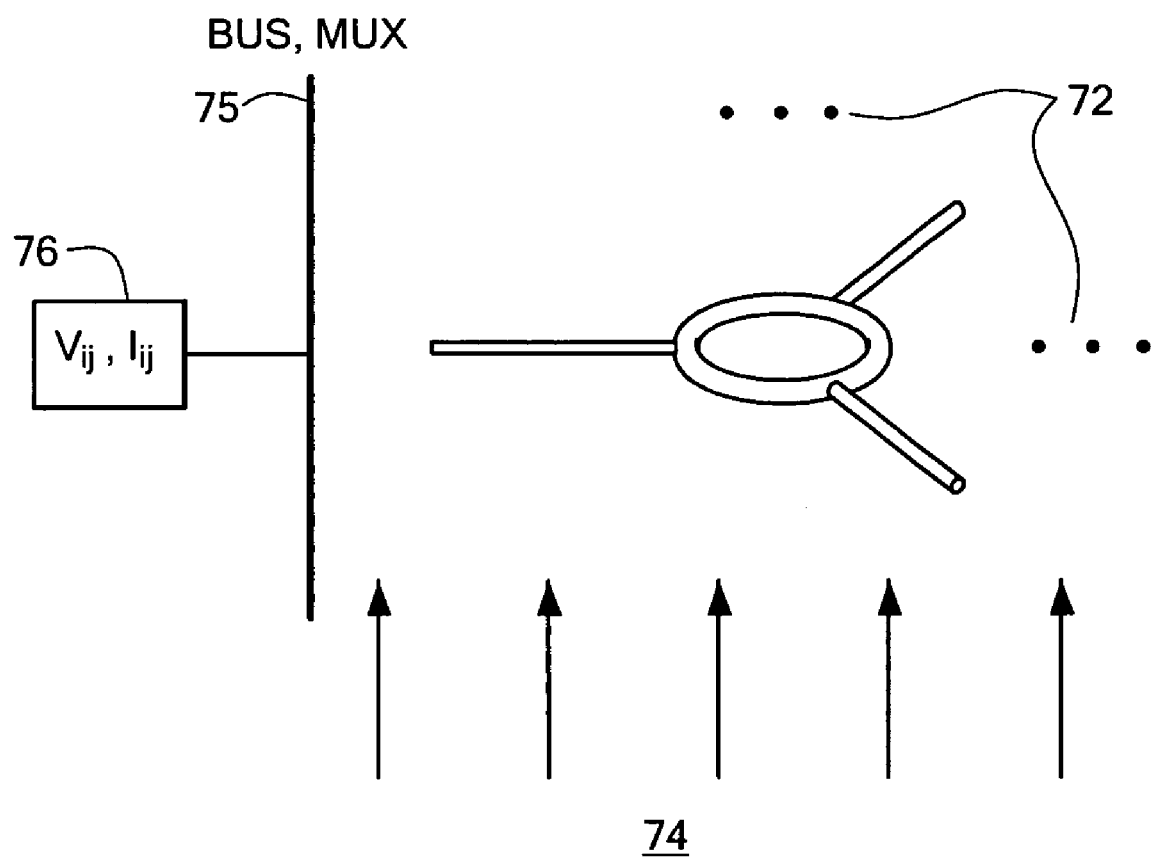
FIG. 4 illustrates a device of the invention for detecting magnetic flux.

For use in detecting magnetic flux, the device of FIGS. 1 and 2 are used as illustrated in FIG. 4. A quantum junction device 17 of the type illustrated in FIG. 1 is provided either singly or in an array 72 for detecting the magnetic flux 74 over an area. Electronics 76 is provided, which in the case of multiple devices 70, is provided as an array of voltage/current source/detector elements or multiplexed over a bus 75 as above. The direction in which current proceeds through the quantum junction device 70 is an indication of the presence and/or level of the magnetic flux 70 at a particular point or over an area where multiple devices are provided.

These and other embodiments of the invention are to limited in scope only in accordance with the following claims.

What is claimed is:

1. A quantum junction device functioning as a detector comprising:
   a micro/nano scale selectively conducting junction having a limited number of channels operating in a non-Fermi liquid regime;
   a first conductor in electrical connection to said junction;
   second and third electrical conductors in electrical connection to said junction and spaced apart from each other and said first conductor;
   a magnetic field existing in a region containing said junction; and
   means for detecting a direction of current through said junction for identifying the magnitude of said magnetic field, said current direction being between a first path containing said first and second conductors and a second path containing said first and third conductors as a function of said magnetic field.

2. The junction of claim 1 wherein said junction is a loop with said magnetic field having an axis through said loop.

3. The junction of claim 2 wherein said junction has less than 100 conduction channels;
   said junction is operated at a temperature above or below a superconducting temperature;
   said junction is maintained in at condition in which electron behavior is characterized by a Luttinger liquid; and
   electron behavior is superconducting like at a non-superconducting temperature.

4. The junction of claim 1 wherein said junction has less than 100 conduction channels.

5. The junction of claim 1 wherein said junction is operated at a temperature above or below a superconducting temperature.

6. The junction of claim 1 wherein said junction is maintained in at condition in which electron behavior is characterized by a Luttinger liquid.

7. The junction of claim 1 wherein electron behavior is superconducting like at a non-superconducting temperature.

8. The junction of claim 1 further including means for applying or sensing voltage or current at one or more of said electrical conductors.

9. The junction of claim 1 wherein said loop is a closed loop of arbitrary shape.

10. The use of the device of claim 1 to detect a magnetic field within a brain.

11. A method for using quantum junction device as a detector comprising:

providing a micro/nano scale selectively conducting loop junction having a limited number of channels operating in a non-Fermi liquid regime and further having first, second and third electrical conductors in electrical connection to said junction and spaced apart from each other and said function being in a region having a magnetic field; and detecting a direction of current through said junction for identifying the magnitude of said magnetic field, said current direction being between a first path containing said first and second conductors and a second path containing said first and third conductors through said junction and as a function of said magnetic field.

12. The method of claim 11 including aligning the magnetic field to lie along an axis through said loop.

13. The method of claim 12 including providing said junction with less than 100 conduction channels;

operating said junction at a temperature above or below a superconducting temperature;

maintaining said junction in at condition in which electron behavior is characterized by a Luttinger liquid; and wherein electron behavior is superconducting like at a non-superconducting temperature.

14. The method of claim 11 including the step of providing said junction with less than 100 conduction channels.

15. The method of claim 11 including operating said junction at a temperature above or below a superconducting temperature.

16. The method of claim 11 including maintaining said junction at condition in which electron behavior is characterized by a Luttinger liquid.

17. The method of claim 11 wherein electron behavior is superconducting like at a non-superconducting temperature.

18. The method of claim 11 further including applying or sensing voltage or current at one or more of said electrical conductors.

19. The method of claim 18 further including sensing or applying magnetic flux along said axis.

20. The method of claim 11 further including sensing or applying magnetic flux along said axis.

21. The method of claim 11 wherein said loop is a closed loop of arbitrary shape.

* * * * *